(12) United States Patent
Garcia et al.

(10) Patent No.: US 8,189,336 B2
(45) Date of Patent: May 29, 2012

(54) COMPOSITE COVER WITH INTEGRAL HEAT SINK

(75) Inventors: Pete R. Garcia, Troy, MI (US); Tejinder Singh, Commerce Township, MI (US); James D. Hendrickson, Belleville, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 99 days.

(21) Appl. No.: 12/871,567

(22) Filed: Aug. 30, 2010

(65) Prior Publication Data

US 2011/0182034 A1 Jul. 28, 2011

Related U.S. Application Data

(60) Provisional application No. 61/297,527, filed on Jan. 22, 2010.

(51) Int. Cl.
*H05K 7/20* (2006.01)
*B60W 10/04* (2006.01)

(52) U.S. Cl. ........ 361/714; 361/709; 361/715; 361/719; 361/679.46; 361/679.54; 361/704; 361/707; 165/80.2; 165/80.3; 165/104.33; 165/185; 310/54; 310/64; 180/65.1; 180/65.21; 180/337

(58) Field of Classification Search ............. 361/679.46, 361/679.54, 704–712, 714–720; 165/104.33, 165/104.34, 185, 80.2, 80.3; 180/291, 65.1, 180/65.21, 65.22, 337, 339, 65.6, 65.8; 174/520, 174/526, 533; 310/54, 64, 67 R, 68 R, 68 B, 112, 75 R, 52, 56–59

See application file for complete search history.

(56) References Cited

U.S. PATENT DOCUMENTS

| | | | | |
|---|---|---|---|---|
| 4,240,524 A | * | 12/1980 | Katayama et al. | 184/6.12 |
| 5,361,650 A | * | 11/1994 | Klecker et al. | 74/606 R |
| 5,709,134 A | * | 1/1998 | Ulm | 74/606 R |
| 6,688,383 B1 | * | 2/2004 | Sommer et al. | 165/200 |
| 7,050,305 B2 | * | 5/2006 | Thorum | 361/719 |
| 7,749,134 B2 | * | 7/2010 | Wetzel et al. | 477/34 |
| 7,859,852 B2 | * | 12/2010 | Wetzel et al. | 361/749 |
| 7,973,437 B2 | * | 7/2011 | Feier et al. | 310/64 |
| 2006/0023426 A1 | * | 2/2006 | Murakami et al. | 361/715 |
| 2011/0044005 A1 | * | 2/2011 | Wetzel et al. | 361/714 |

* cited by examiner

*Primary Examiner* — Michail V Datskovskiy

(57) ABSTRACT

A composite cover for a portion of a motor vehicle transmission has an integral, internal heat sink to which an electronic controller is attached. The cover, which may be fabricated of any temperature appropriate plastic or composite, closes off and protects that portion of a motor vehicle transmission having electrical and electronic components such as valves, solenoids, motors and sensors. Spaced from the inside surface of the cover where it is subjected on both sides to flow of transmission fluid is a plate or heat sink. An electronic controller is disposed on the outside of the cover and attached by heat transferring mechanical fasteners such as studs or bolts to the plate inside the cover. Preferably, the housing of the controller also includes a heat sink.

20 Claims, 3 Drawing Sheets

US 8,189,336 B2

COMPOSITE COVER WITH INTEGRAL HEAT SINK

CROSS REFERENCE TO RELATED APPLICATION

This application claims the benefit of U.S. Provisional Patent Application Ser. No. 61/297,527, filed Jan. 22, 2010, which is hereby incorporated in its entirety herein by reference.

FIELD

The present disclosure relates to a cover for a motor vehicle transmission and more particularly to a composite cover with an integral heat sink for a motor vehicle transmission.

BACKGROUND

The statements in this section merely provide background information related to the present disclosure and may or may not constitute prior art.

Many types of modern transmissions include associated electronic controllers. Typically, due to the number of electrical connections between circuitry within the controller and solenoids, motors and other devices within the transmission, they are desirably located as near as possible to the transmission. Because of service considerations, however, they are generally not located within the transmission but on the outside of the transmission housing and utilize an electrical connector or feedthrough to connect the controller to the components within the transmission.

While external mounting of the controller on the transmission satisfies service issues, it does create a compromise regarding cooling of the controller. If the controller were mounted within the transmission, the transmission cooling circuit could be relied upon to carry away heat from the controller and maintain it at a proper and safe operating temperature. Located on the outside of a transmission, cooling of the controller and maintenance of a proper and safe operating temperature must typically be achieved by airflow over heat sink fins or by conduction of heat to a relatively large heat sink such as a fender or other body panel. Using body panels as heat sinks once again raises the less than desirable situation of placing the electronic controller at some distance from the transmission.

From the foregoing, it is apparent that the placement of an electronic controller to satisfy the competing requirements of proximity to the transmission and thus minimum wiring and weight while also providing for the necessary heat dissipation is an engineering challenge. The present invention is directed to solving this engineering challenge and satisfying these competing design goals.

SUMMARY

The present invention provides a composite cover for a portion of a motor vehicle transmission having an integral, internal heat sink to which an electronic controller is attached. The cover, which may be fabricated of any temperature appropriate plastic or composite, closes off and protects that portion of a motor vehicle transmission having electrical and electronic components such as valves, solenoids, motors and sensors. Spaced from the inside surface of the cover where it is subjected on both sides to flow of transmission fluid is a plate or heat sink. An electronic controller is disposed on the outside of the cover and attached by heat transferring mechanical fasteners such as studs or bolts to the plate inside the cover. Preferably, the housing of the controller will include heat sink fins.

Thus it is an aspect of the present invention to provide a cover and controller for a motor vehicle transmission.

It is a further aspect of the present invention to provide a composite cover having an integral heat sink for a motor vehicle transmission.

It is a still further aspect of the present invention to provide a composite cover having an electronic controller and an integral heat sink for a motor vehicle transmission.

It is a still further aspect of the present invention to provide a composite cover having an electronic controller and an integral heat sink exposed to transmission fluid flow for a motor vehicle transmission.

It a still further aspect of the present invention to provide a composite cover having an integral heat sink exposed to transmission fluid flow for a motor vehicle transmission.

It a still further aspect of the present invention to provide a composite cover having an electronic controller with both heat sink fins and an internal heat sink exposed to transmission fluid flow.

Further aspects, advantages and areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
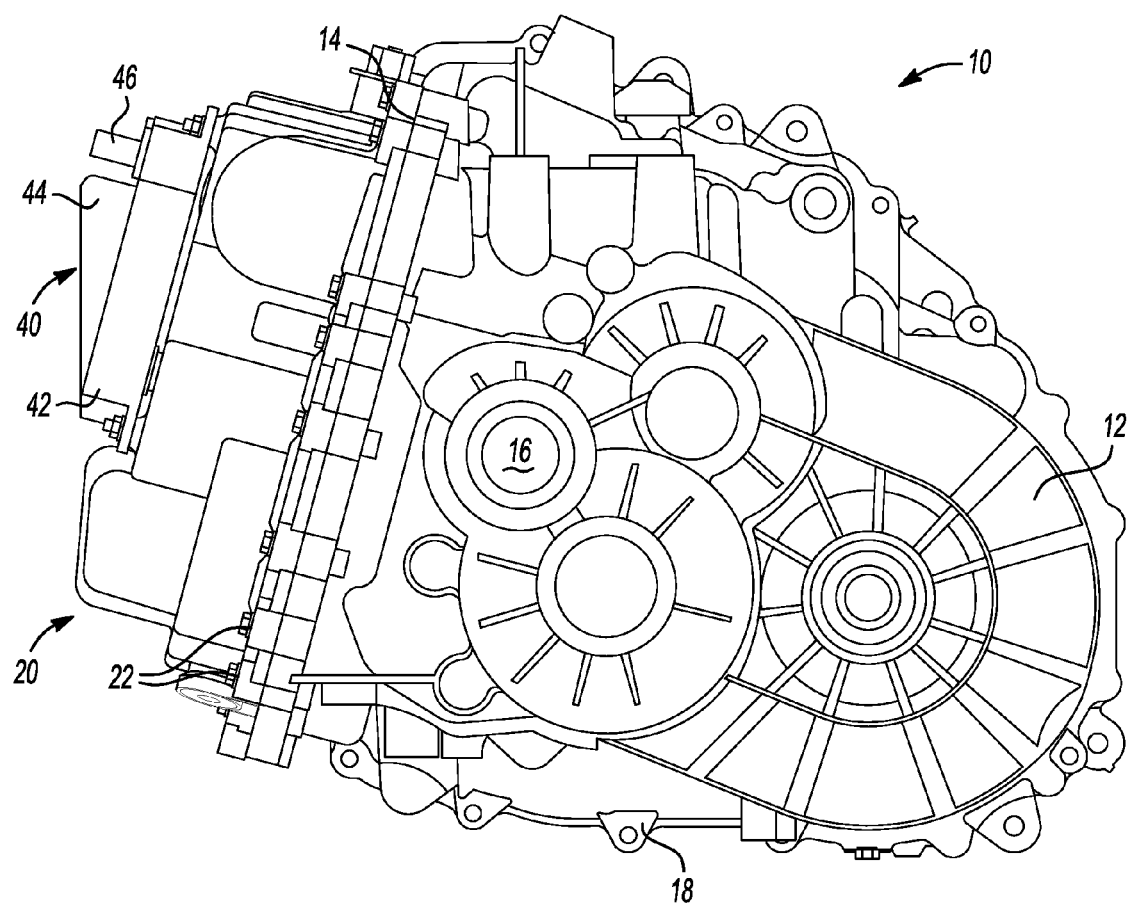
FIG. 1 is an end view of a motor vehicle transmission having a cover and controller according to the present invention.

With reference now to FIG. 1, a motor vehicle transmission is illustrated and generally designated by the reference number 10. The motor vehicle transmission 10 may be a manual transmission, an automated mechanical transmission (AMT), an automatic transmission, for example, having a plurality of planetary gear sets, a dual clutch transmission (DCT) or other motor vehicle transmission. The transmission 10 includes a housing 12 which encloses, positions and protects the various components of the transmission 10. As such, it includes various mounting surfaces, such as the surface 14, openings, such as the opening 16 for a shaft, and flanges, such as the flange 18 for assembly.

Figure 2:
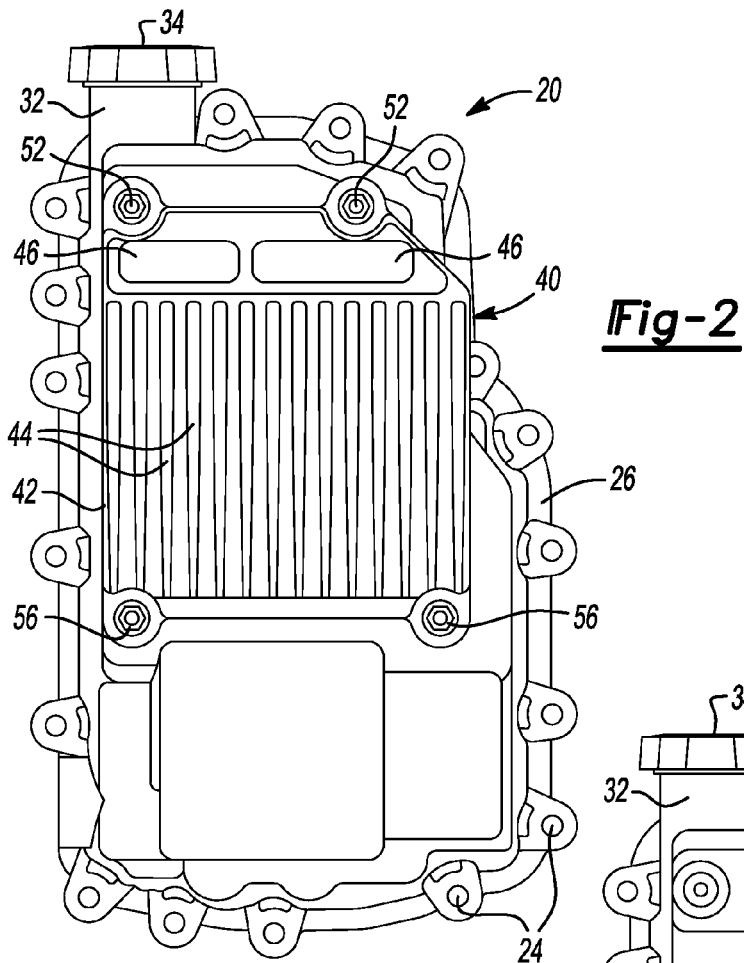
FIG. 2 is a top plan view of a composite cover and controller for a transmission according to the present invention.
Figure 3:
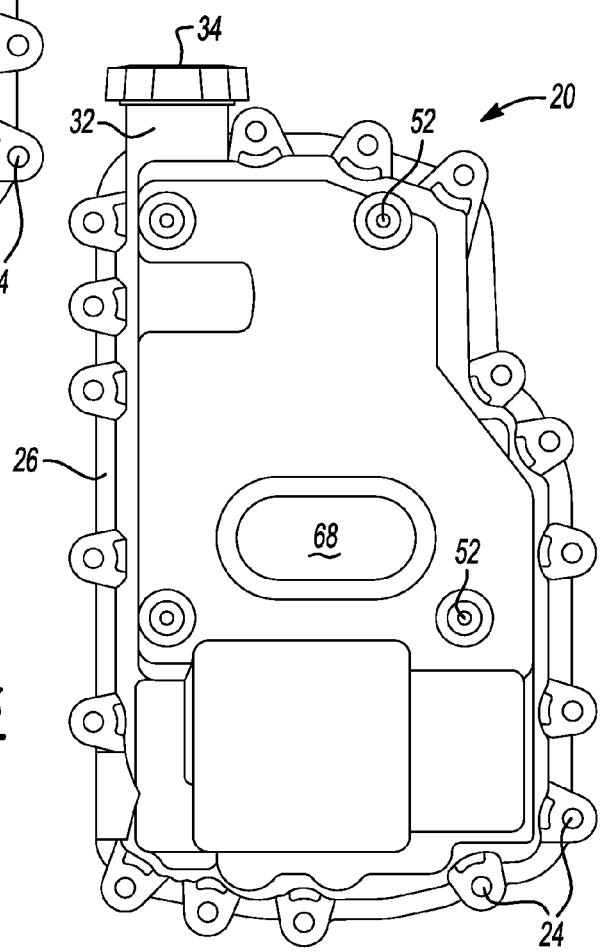
FIG. 3 is a top plan view of a composite cover for a transmission according to the present invention with the controller removed.

Referring now to FIGS. 1, 2 and 3, the surface 14 of the transmission housing 12 receives and sealingly mounts a composite cover 20. The composite cover 20 is disposed over an opening proximate solenoids, valves, sensors and other electric and electronic components (not illustrated) within the transmission 10 and covers and protects them. The composite cover 20 may be fabricated of any temperature suitable plastic or composite such as nylon 66, nylon 67 or one of many similar materials. Typically, a plurality of threaded fasteners 22 removably secure the composite cover 20 to the transmission 10. The composite cover 20 includes a like plurality of openings 24 in a peripheral flange 26 through which the fasteners 22 pass. The composite cover 20 may also include a port or cylindrical extension 32 which receives a removable transmission fluid filler cap 34 and provides access to the transmission 10 for fluid addition.

Attached to the composite cover 20 is an electronic controller 40. The electronic controller 40 includes a housing 42 which is preferably rugged and cast of a metal such as aluminum. The housing 42 preferably includes a heat sink 44 which comprehends a plurality of fins or similar heat transferring structures. Secured to the housing 42 of the electronic controller 40 are one, two or more electrical connectors 46. The electrical connectors 46 mate with complementary connectors (not illustrated) and provide data and signals from the controller 40 to, and receive data and signals from, other electrical and electronic components (not illustrated) in the motor vehicle.

Referring now to FIGS. 2, 3, 4 and 5, the composite cover 20 includes a plurality of stanchions, studs or bolts 52 which extend from the inside of the composite cover 20 to the outside. The stanchions, studs or bolts 52 may be cast in place in the composite cover 20 or they may be assembled with it through openings formed therein. At their outer ends, the stanchions, studs or bolts 52 include threaded portions 54 and receive nuts or similar fasteners 56 which retain the electronic controller 40 on the composite cover 20. The stanchions, studs or bolts 52 are heat transfer devices and thus are preferably fabricated of metal. Moreover, since the junctions between the stanchions, studs or bolts 52 and the housing 42 of the electronic controller 40 are points of heat transfer, a positive and intimate connection therebetween is desirable.

While in the embodiment illustrated, four of the stanchions, studs or bolts 52 are utilized, it should be appreciated that more (or fewer) stanchions, studs or bolts 52 may be utilized with a concomitant increase (or decrease) in the heat transfer function. The utilization of more (or fewer) stanchions, studs or bolts 52 is manifestly within the purview and parameters of the present invention.

As noted directly above, the stanchions, studs or bolts 52 extend to the inside of the composite cover 20 and support a plate or heat sink 60 away or spaced from the inside surface 62 of the composite cover 20. This spacing may be achieved by the construction or configuration of the stanchions, studs or bolts 52 or may be achieved by the use of separate spacers or washers (not illustrated). The plate or heat sink 60 essentially conforms to the inside of the composite cover 20 and thus may define a regular or somewhat irregular shape. The inside ends of the stanchions, studs or bolts 52 may be threaded or include circumferential grooves 64 as illustrated. A plurality of fasteners 66 such as nuts, C-washers, speed nuts or mechanical upset such as staking or similar means may be utilized to positively secure the plate or heat sink 60 to the stanchions, studs or bolts 52. As will be appreciated, since the junctions between the stanchions, studs or bolts 52 and the plate or heat sink 60 are points of heat transfer, a positive and intimate connection therebetween is desirable.

Figure 4:
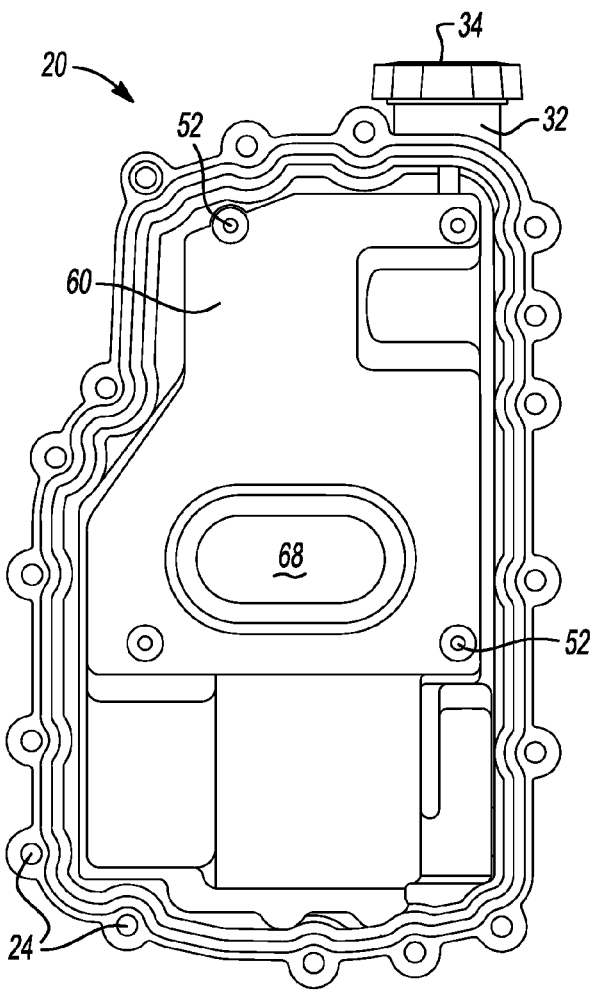
FIG. 4 is a bottom (inside) plan view of a composite cover for a transmission according to the present invention showing the integral heat sink.
Figure 5:
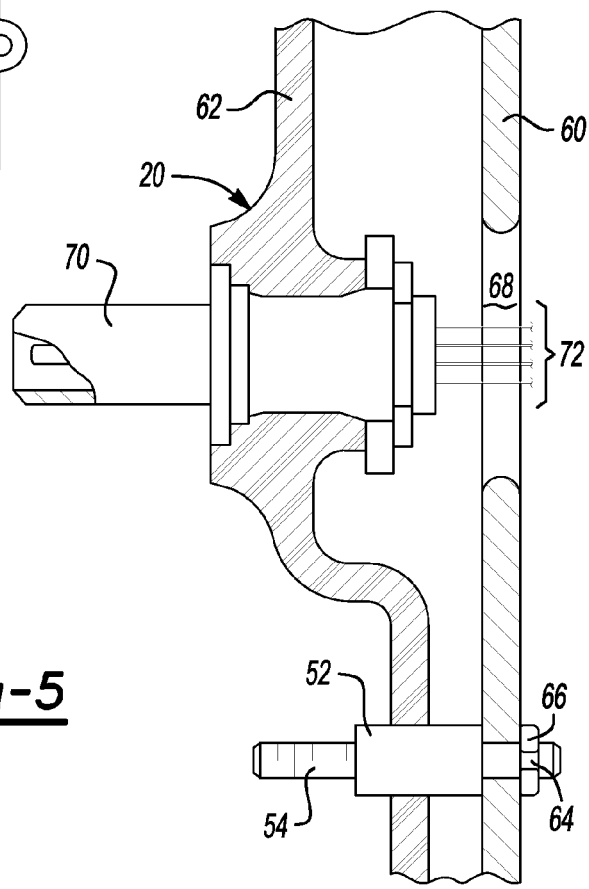
FIG. 5 is a fragmentary, sectional view of an electrical connector and a portion of a composite cover and integral heat sink for a transmission according to the present invention.

As illustrated in FIG. 4, the plate or heat sink 60 (and the composite cover 20) include an opening 68 through which an electrical connector or passthrough 70 extends. The electrical connector 70 mates with a complementary connector (not illustrated) in the electronic controller 40 and provides and receives data and signals in a plurality of wires or cables 72 which link to the solenoids, valves and sensors and other devices (all not illustrated) within the transmission 10.

It will be appreciated that the shape or outline and size of the plate or heat sink 60 is or may be dictated by many variables, such as the shape of the opening in the transmission 10, the shape of the composite cover 20, the desired heat transfer, transmission fluid flow within the adjacent region of the transmission 10 and components within and connections to such components within the transmission 10. Thus, wide variation of the size and shape or outline of the plate or heat sink 60 is to be expected and is well within the purview and scope of this invention. The plate or heat sink 60 is preferably fabricated of a metal having good heat transfer characteristics such as aluminum, copper, steel and the like.

The description of the invention is merely exemplary in nature and variations that do not depart from the gist of the invention are intended to be within the scope of the invention. Such variations are not to be regarded as a departure from the spirit and scope of the invention.

What is claimed is:

1. A composite cover and heat sink comprising, in combination,
a cover having a first, outside surface, a second, inside surface and a mounting flange defining a plurality of through apertures, an electronic control module on said outside surface of said cover, a heat sink adjacent said inside surface of said cover and a plurality of heat transferring mounting members extending from said electronic control module, through said composite cover and to said heat sink.

2. The composite cover and heat sink of claim 1 wherein said cover is fabricated of one of nylon 66 and nylon 67.

3. The composite cover and heat sink of claim 1 wherein said electronic control module includes at least one electrical connector.

4. The composite cover and heat sink of claim 1 wherein said heat transferring members are studs having a center portion secured to said cover and at least one threaded end.

5. The composite cover and heat sink of claim 1 further including an electrical connector mounted in said cover.

6. The composite cover and heat sink of claim 5 further including an opening in said heat sink for receiving electrical conductors connected to said electrical connector in said cover.

7. The composite cover and heat sink of claim 1 further including heat transfer fins on said electronic control module.

8. A composite cover for a motor vehicle transmission comprising, in combination,
a cover for closing off a portion of a motor vehicle transmission, said cover having an outside surface, an inside surface and a peripheral flange defining a plurality of mounting holes, an electronic module disposed adjacent said outside surface, a heat sink disposed adjacent said inside surface and heat transfer means extending between said electronic module and said heat sink.

9. The composite cover for a motor vehicle transmission of claim 8 further including an electrical connector mounted in said cover.

10. The composite cover for a motor vehicle transmission of claim 9 further including an opening in said heat sink for receiving electrical conductors connected to said electrical connector in said cover.

11. The composite cover for a motor vehicle transmission of claim 8 further including heat transfer fins on said electronic module.

12. The composite cover for a motor vehicle transmission of claim 8 wherein said cover is fabricated of one of nylon 66 and nylon 67.

13. The composite cover for a motor vehicle transmission of claim 8 wherein said electronic control module includes at least one electrical connector.

14. The composite cover for a motor vehicle transmission of claim 8 wherein said heat transfer means are studs having a center portion secured to said cover and at least one threaded end.

15. A composite cover for a portion of a motor vehicle transmission, comprising, in combination, a cover for closing off an opening of a motor vehicle transmission, said cover having an outside surface, an inside surface and a peripheral flange, an electronic module disposed proximate said outside surface, a heat sink disposed adjacent said inside surface and means extending between said electronic module and said heat sink and through said cover for transferring heat from said electronic module to said heat sink and attaching said electronic module and said heat sink to said cover.

16. The composite cover for a portion of a motor vehicle transmission of claim 15 further including a plurality of mounting holes in said peripheral flange.

17. The composite cover for a portion of a motor vehicle transmission of claim 15 wherein said cover is fabricated of one of nylon 66 and nylon 67.

18. The composite cover for a portion of a motor vehicle transmission of claim 15 wherein said electronic module includes at least one electrical connector.

19. The composite cover for a portion of a motor vehicle transmission of claim 15 wherein said means extending between said electronic module and said heat sink are studs having a center portion disposed within said cover and at least one threaded end.

20. The composite cover for a portion of a motor vehicle transmission of claim 15 further including heat transfer fins on said electronic module.

\* \* \* \* \*